United States Patent
Liu et al.

(10) Patent No.: US 8,945,983 B2
(45) Date of Patent: Feb. 3, 2015

(54) SYSTEM AND METHOD TO IMPROVE PACKAGE AND 3DIC YIELD IN UNDERFILL PROCESS

(71) Applicant: Taiwan Semiconductor Manufacturing Company, Ltd., Hsin-Chu (TW)

(72) Inventors: Yen-Hsin Liu, New Taipei (TW); Cing He Chen, Hsin-Chu (TW); Kewei Zuo, Xinbei (TW); Chien Rhone Wang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/836,692

(22) Filed: Mar. 15, 2013

(65) Prior Publication Data
US 2014/0183760 A1   Jul. 3, 2014

Related U.S. Application Data

(60) Provisional application No. 61/747,103, filed on Dec. 28, 2012.

(51) Int. Cl.
*H01L 21/00* (2006.01)
*H01L 21/56* (2006.01)
*H01L 23/18* (2006.01)

(52) U.S. Cl.
CPC ............... *H01L 21/56* (2013.01); *H01L 23/18* (2013.01); *H01L 2224/32225* (2013.01); *H01L 2924/19105* (2013.01)

USPC ........... 438/106; 438/127; 438/108; 257/687; 257/E21.503; 257/E21.502; 257/E23.01

(58) Field of Classification Search
CPC ............................ H01L 21/00; H01L 2224/00
USPC ................. 438/108, 127; 257/687, E21.503, 257/E21.502, E23.01, E23.069
See application file for complete search history.

(56) References Cited

U.S. PATENT DOCUMENTS

| | | | | |
|---|---|---|---|---|
| 8,609,462 | B2* | 12/2013 | Chen et al. ..................... | 438/107 |
| 2004/0238602 | A1* | 12/2004 | Furuno et al. ............. | 228/180.22 |
| 2006/0148136 | A1* | 7/2006 | Odegard et al. ............... | 438/127 |
| 2007/0269930 | A1* | 11/2007 | Gupta et al. .................. | 438/108 |
| 2011/0292561 | A1* | 12/2011 | Kamimura et al. ........... | 361/234 |
| 2012/0288996 | A1* | 11/2012 | Too et al. ...................... | 438/108 |
| 2013/0095608 | A1* | 4/2013 | Chen et al. .................... | 438/107 |

OTHER PUBLICATIONS

Underfilling in the era of high density/3D interconnect: a closer look, Jan. 3, 2012, Micronews—Advance Packaging, pp. 1-5.*

(Continued)

*Primary Examiner* — Telly Green
(74) *Attorney, Agent, or Firm* — Slater & Matsil, L.L.P.

(57) ABSTRACT

A method embodiment includes forming a packaging unit by attaching a die to a packaging substrate, applying plasma treatment to a first portion of the packaging substrate, wherein the first portion corresponds to a portion of the packaging substrate underneath the die, not applying plasma treatment to a second portion of the packaging substrate, wherein the second portion of the packaging substrate surrounds the first portion of the packaging substrate, and applying an underfill material over the first portion of the packaging substrate.

20 Claims, 8 Drawing Sheets

(56) References Cited

OTHER PUBLICATIONS

Wang, J., et al., "Methods of Underfill Flow Voids Detection and Minimization in Flip Chip Package," Electronic Components and Technology Conference, 2005, p. 190-195.

Jalar, A., et al., "The Effect of Underfill Fillet Geometry to Die Edge Stress for Flip Chip Packaging," Advanced Materials Research, vols. 148-149, 2011, pp. 1108-1111.

* cited by examiner

SYSTEM AND METHOD TO IMPROVE PACKAGE AND 3DIC YIELD IN UNDERFILL PROCESS

This application claims the benefit of U.S. Provisional Application No. 61/747,103 filed on Dec. 28, 2012, entitled "Novel Methodology to Improve Package and 3DIC Yield in Underfill Process," which application is hereby incorporated herein by reference.

BACKGROUND

In advanced integrated circuit (IC) packaging technologies, such as 3DIC and lead-free packaging, there are continuing trends toward higher chip density and a higher number of input/output pads. These trends have resulted in the shrinking of distances between various IC components, such as flip-chip bonded active dies and other surface mount devices (e.g., passive components) in the IC package.

As part of the IC packaging process, underfill (e.g., a polymer) may be dispensed under dies to relieve stress and provide structural support. Typically, the underfill dispensing process includes applying a plasma treatment to a package substrate and jetting underfill over the substrate under a die. The plasma treatment changes the surface properties of the substrate to be hydrophilic, allowing the underfill to flow into gaps between the die and the substrate via capillary force.

Because of variations in gap volume and underfill weight, a large fillet width may results from this process. Excess fillet width may cause various problems in the IC package, such as die edge cracking. Furthermore, issues may arise if underfill comes in contact with surface mount devices (SMDs) in the proximity of the die. For example, underfill and SMDs are formed of different materials and have different thermal coefficients of expansion. Therefore, if underfill comes in contact with a SMD, cracks and broken connections may result during subsequent thermal processes.

Furthermore, underfill applied with known processes may display an irregular fillet. That is, fillet width may be unevenly distributed and have a large standard deviation ($\sigma$). For example, underfill applied with known processes may have a fillet width 3$\sigma$ value of 400 µm or more. This large standard deviation of fillet widths may necessitate the placement of limiting IC design rules on the minimum spacing required between a die and other features (e.g., SMDs) in an IC package.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Various embodiments will be described with respect to embodiments in a specific context, namely an underfill process for 3DIC packaging. Various embodiments may also be applied, however, to other packaging or underfill processes.

A typical integrated circuit (IC) package substrate may be formed of organic or ceramic materials and is naturally hydrophobic. Therefore, underfill material (e.g., a polymer) does not tend to flow over the surface of an untreated package substrate. In order to enable underfill flow, it is known in the art for package substrates to first undergo a plasma treatment process. The plasma treatment process changes the surface properties of the package substrate to be hydrophilic by exposing the surfaces of the package substrate to an appropriate ion. For example, oxygen-containing plasma may be used so that the oxygen ions may react with hydrogen particles in common substrate materials to create a hydrophilic surface. Oxygen-containing plasma may be formed using molecular oxygen, ozone, or other oxygen molecules that readily decomposes into oxygen ions in plasma. Argon plasma may also be used in the plasma treatment process to create a rougher substrate surface that allows for improved underfill flow. When underfill is jetted over the substrate in a subsequent process step, it is able to flow and fill gaps between dies and the substrate via capillary force.

Various embodiments selectively apply localized plasma treatment to portions of the package substrate, creating different hydrophobic or hydrophilic areas on the substrate surface. If argon plasma is also used during plasma treatment, the localized treatment will produce different areas of rough and smooth textures on the substrate as well. Portions of the packaging substrate corresponding to a die (i.e., the portions underneath the die) undergo plasma treatment while other portions of the packaging substrate bounding the sides of the die remain untreated. When underfill is subsequently jetted under the die, the untreated substrate portions act as a boundary (i.e., the untreated substrate surfaces are hydrophobic and impede underfill flow). In this manner, underfill fillet width may be limited. Furthermore, as a result of this process, underfill fillet width may be substantially uniform and exhibit a small standard deviation ($\sigma$). Therefore, in accordance with various embodiments, IC structures may include smaller and more uniformly distributed underfill fillets.

Figure 1:
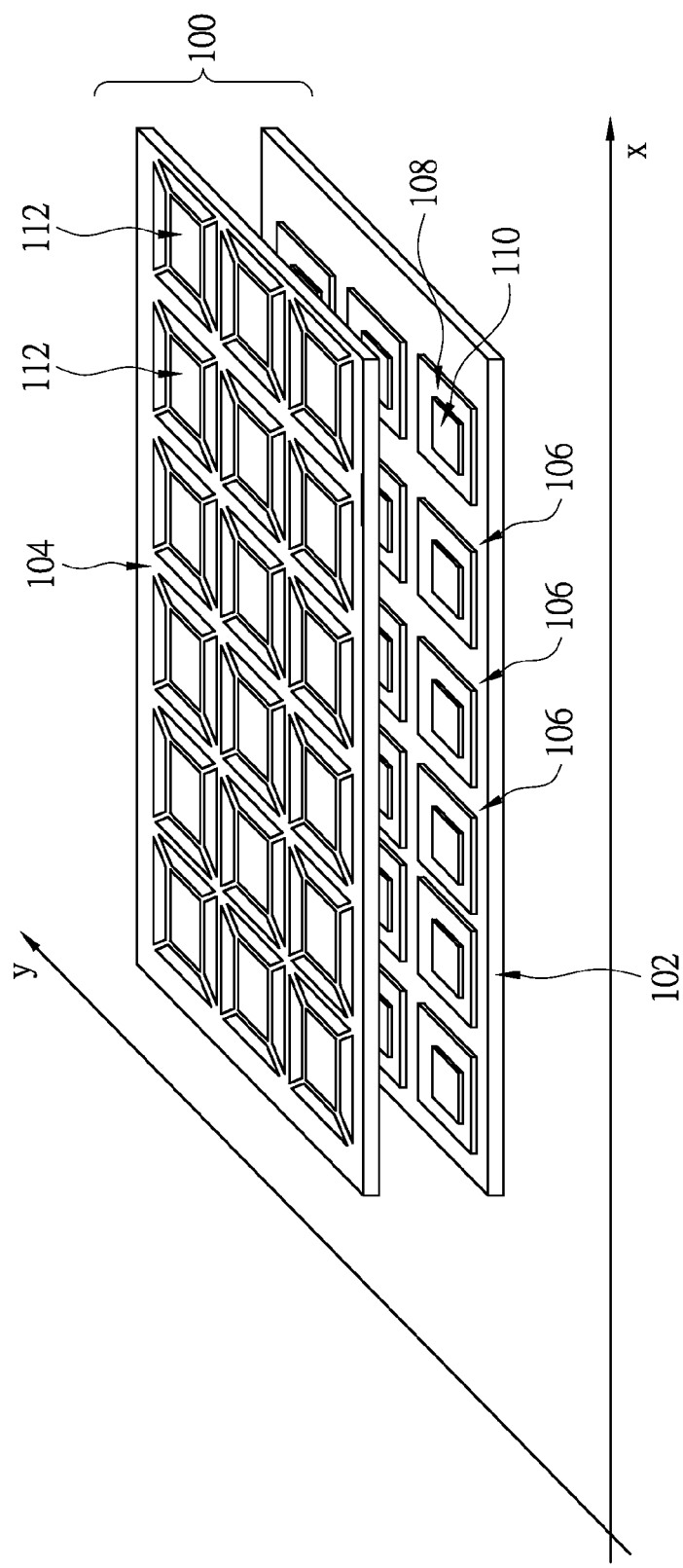
FIG. 1 is a diagram of a packaging jig in accordance with various embodiments.

As illustrated in FIG. 1, various embodiments utilize a packaging jig 100 to hold and cover selective portions of various IC packaging units 106 during a plasma treatment process. Jig 100 may be made of a metal material although other materials may be used as well. Jig 100 includes a top cover 104 and a bottom carrier 102. In various embodiments where jig 100 is made of a metallic material, magnets may optionally be used to secure top cover 104 to bottom carrier 102 during plasma treatment. Additionally, a polymer material (e.g., polymide (PI), rubber, or polytetrafluoroethylene (PTFE)) may optionally be included in portions of jig 100 (either in top cover 104 and/or bottom carrier 102) that are configured to contact packaging units 106.

Bottom carrier 102 may be a solid carrier or it may be hollow in parts. Various packaging units 106 are distributed and placed over bottom carrier 102. Each packaging unit 106 includes a substrate 108 and a die 110, which have been assembled together. Although FIG. 1 shows packaging units 106 having only one die 110 per unit, each packaging unit 106 may include a varying plurality of dies 110. Each packaging unit 106 may further include various surface mount devices (SMDs) such as passive components (not shown).

Top cover 104 includes a plurality of openings 112 corresponding to dies 110. Openings 112 expose regions of substrate 108 corresponding to dies 110 during plasma treatment so that these portions of substrate 108 may be treated appropriately (i.e., these portions will become hydrophilic). In various embodiments the size of openings 112 may be slightly larger than the size of the corresponding dies 110. That is, a gap may exist between an edge of a die 110 and a nearest edge of a corresponding opening 112.

Top cover 104 shields at least a portion of substrate 108 surrounding the edges of each die 110. During plasma treatment, these shielded portions of substrate 108 will remain untreated (i.e., the surfaces of these portions of substrate 108 will remain hydrophobic). Therefore, these shielded portions of substrate 108 act as boundary lines stopping underfill flow and controlling fillet width.

Furthermore, certain openings 112 may also expose various SMDs in packaging unit 106. Alternatively, top cover 104 may shield various SMDs in packaging unit 106. When top cover 104 shields various SMDs, top cover 104 does not come in contact with the various SMDs due to a plurality of grooves in top cover 104. Therefore, after packaging units 106 undergo plasma treatment, the packaging substrate surrounding a particular SMD may be treated or untreated. However, dies 110 and various SMDs are separated by at least a portion of untreated substrate 108.

Figure 1A:
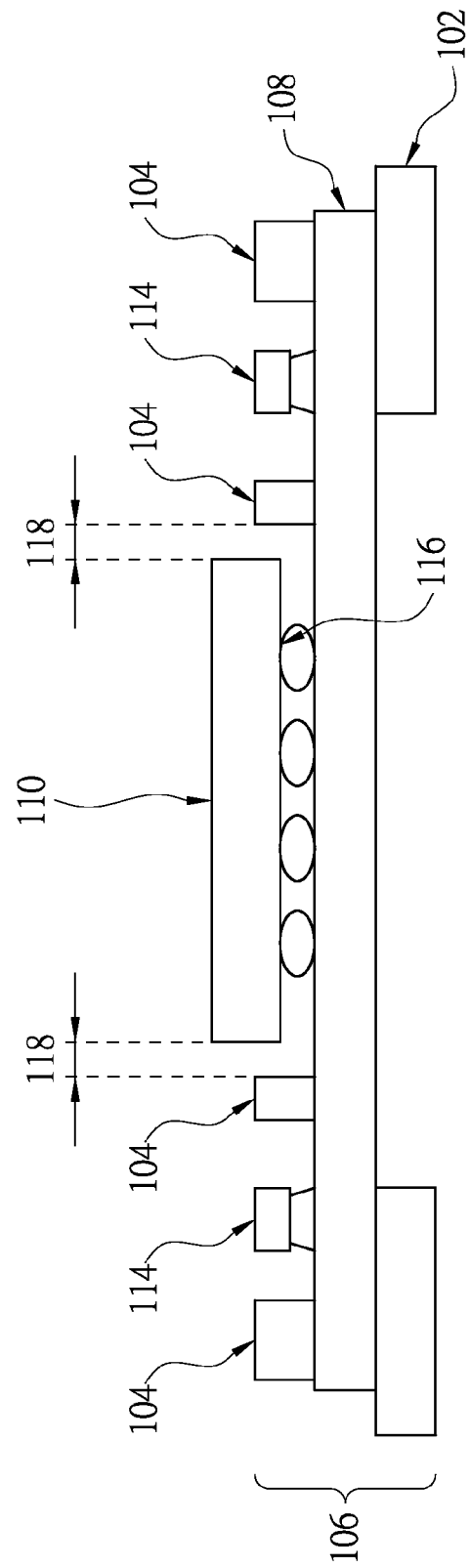
FIGS. 1A-1C illustrate various cross-sectional views of alternative configurations of the packaging jig in FIG. 1 in accordance with various embodiments.
Figure 1B:
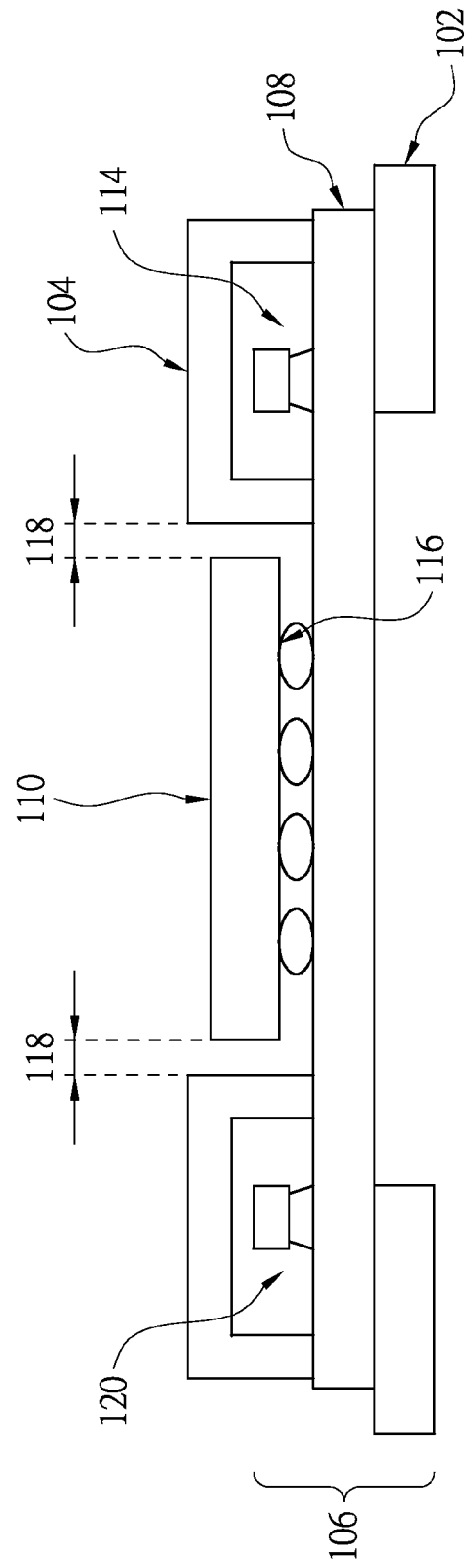
Figure 1C:
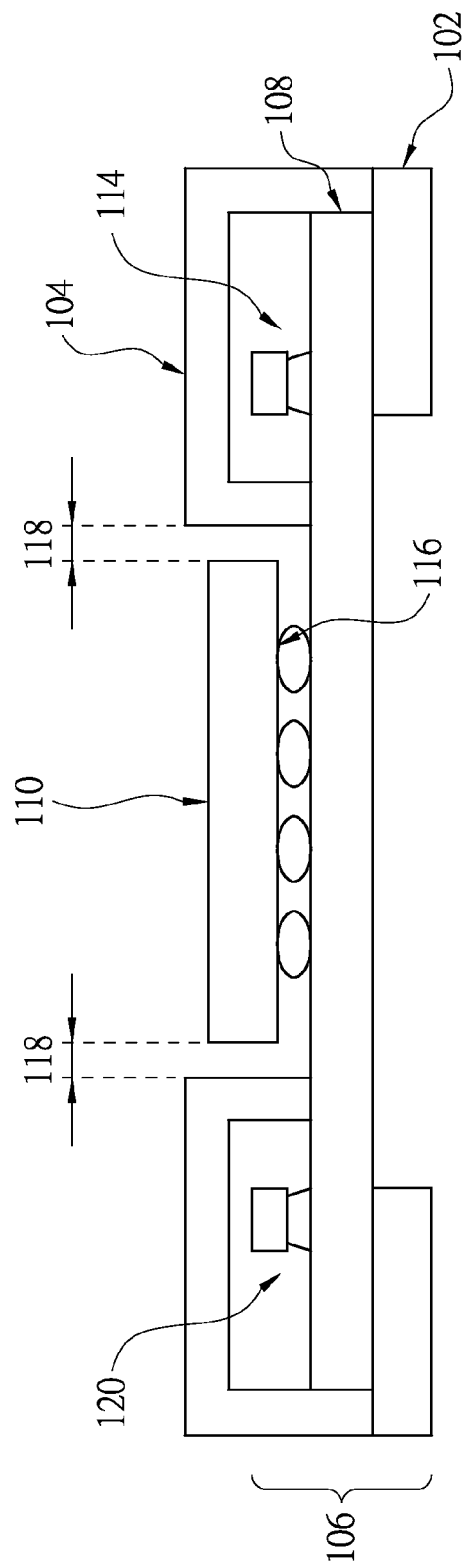

FIGS. 1A-1C illustrate cross-sectional views of alternative configurations for jig 100 in accordance with various embodiments. The cross-sectional views shown in FIGS. 1A-1C may be of any packaging unit 106 in FIG. 1. Furthermore, the cross-sectional views in FIGS. 1A-1C may be taken across either the x or y-axis in FIG. 1. Jig 100 in FIG. 1 may be configured in any of the alternative configurations shown in FIGS. 1A-1C. Jig 100 includes top cover 104 and bottom carrier 102 that hold and cover portions of a packaging unit 106 respectively.

Packaging unit 106 include substrates 108, dies 110, bond pads 116, and SMDs 114. The various components of packaging unit 106 have been assembled together in a previous process step. Die 110 may be bonded onto substrate 108 through a plurality of bond pads 116. The methods of assembly of packaging units 106 are well known in the art and not discussed herein. Top cover 104 does not contact die 110 or SMDs 114. Furthermore, die 110 may be spaced apart from edges of top cover 104 by gaps 118. In various embodiments, gaps 118 may be between about 0.8-1.4 mm. By controlling the size of gaps 118, underfill fillet width in the final packaging unit may be limited.

As shown in FIG. 1A, die 110 and SMDs 114 may be exposed through top cover 104. However, top cover 104 shields a portion of substrate 108 between die 110 and SMDs 114. Alternatively, as shown in FIG. 1B, top cover 104 may shield SMDs 114 as well. However, top cover 104 does not contact SMDs 114 because top cover 104 includes groves 120. In yet another embodiment, illustrated in FIG. 1C, top cover 104 may extend over the peripheral edges of packaging unit 106 and contact bottom carrier 102.

Various embodiments include covering portions of dies 110 with jig 100 during the plasma treatment process. A plasma treatment is applied over the entirety of jig 100 containing packaging units 106. Therefore, jig 100 acts like a stencil, so that selective portions of substrates 108 are exposed to plasma. The portions of substrates 108 exposed during plasma treatment become hydrophilic. Additionally, these exposed portions of substrate 108 may be also be texturized as a result of plasma treatment (e.g., the use of argon plasma results in a rough substrate surface after treatment). Portions of substrates surrounding dies 110 are covered and remain hydrophobic and smooth. Jig 100 may then be removed.

Subsequently, underfill may be jetted under dies 110 using known processes. Because the substrate portions under dies 110 are hydrophilic, the underfill flows easily under the die and fills the areas around bond pads 116 between dies 110 and substrate 108 via capillary force. In embodiments where the treated substrate is texturized, the rough texture also facilitates underfill flow. Advantageously, the hydrophobic and smooth portions of substrates 108 bounding dies 110 act as a barrier, impeding underfill flow, and limiting underfill fillet width. Underfill fillet width may be controlled by limiting the size of gaps 118 (i.e., the spacing between an edge of a die and a nearest edge of top cover 104). Because portions of the substrate act as a barrier, underfill fillet width may be substantially uniform. The underfill fillet boundary may be smooth and have a small σ value. This allows for the loosening of design rule limitations on IC packaging design, and dies may be advantageously designed closer to other components (e.g., SMDs) in the IC package, increasing package density. Furthermore, localized plasma treatment allows for the reliable reduction of fillet width, which may greatly reduce the need to measure and test fillet width of various dies as part of the IC packaging process.

Figure 2:
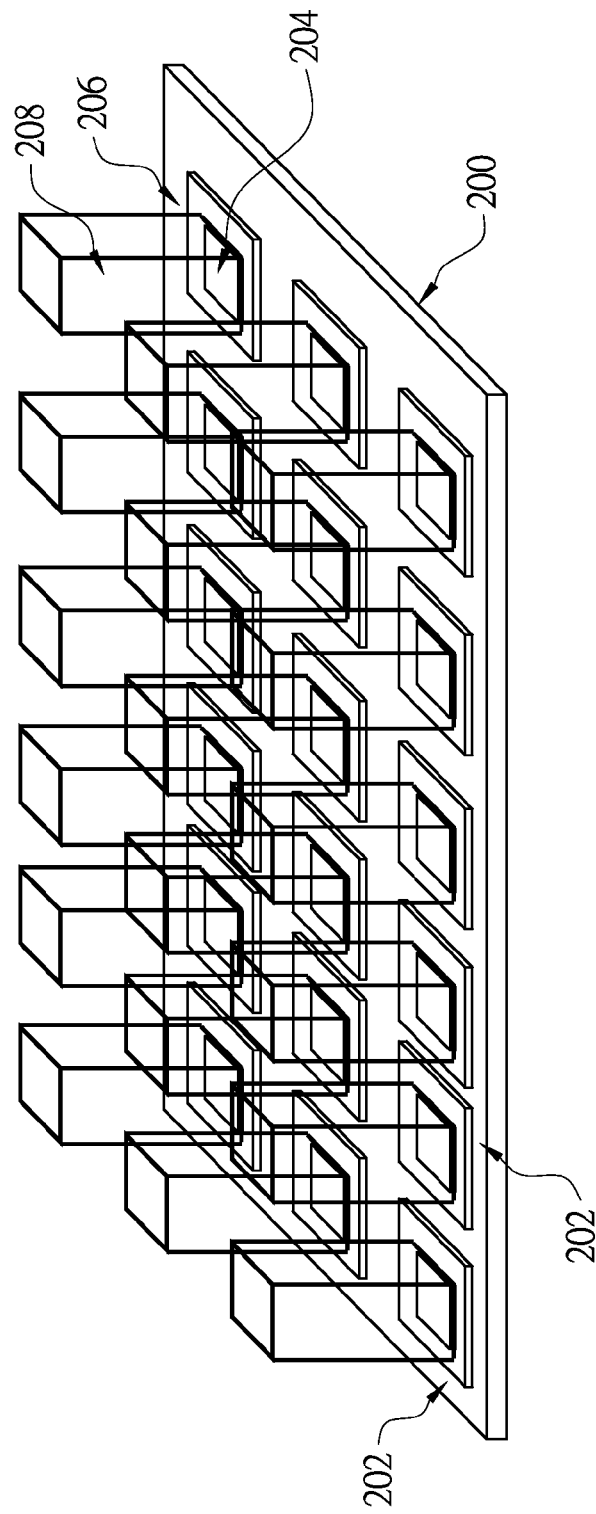
FIG. 2 is a diagram of plasma chambers in accordance with various alternative embodiments.

FIG. 2 illustrates an alternative embodiment of localized plasma treatment in accordance with various embodiments. A plurality of packaging units 202 may be placed or affixed on a bottom carrier 200. Each packaging unit 202 may include substrates 206, dies 204, bond pads (not shown), and SMDs (not shown). Bottom carrier 200 and packaging units 202 may be substantially similar to bottom carrier 102 and packaging units 106 respectively. A plurality of localized plasma chambers 208 corresponding to each die 204 is applied to packaging units 202. Plasma chambers 208 apply localized plasma treatment to portions of substrate 206 corresponding to dies 204. Portions of plasma chambers 208 configured to contact substrates 206 may alternatively include a polymer material. Plasma chambers 208 may be slightly larger than corresponding dies 204. Plasma treatment is applied only correspond portions of substrate 206 under applicable dies 204 within plasma chambers 208. The edges of dies 204 may be separated from edges of plasma chamber 208 by gaps. These gaps function substantially like gaps 118 in FIGS. 1 and 1A-1C.

Plasma chambers 208 may be formed of a metallic material and be configured to contact substrate 206. Plasma chambers 208 may be substantially similar to plasma chambers as is known in the art. For example, plasma chambers 208 may include a vacuum system, gas entrance, gas vent, and the like. However, unlike conventional plasma chambers, each plasma chamber 208 is configured to treat portions of a single packaging unit 202. In contrast, a conventional plasma chamber is configured to treat a plurality of packaging units 202 simultaneously.

Figure 3:
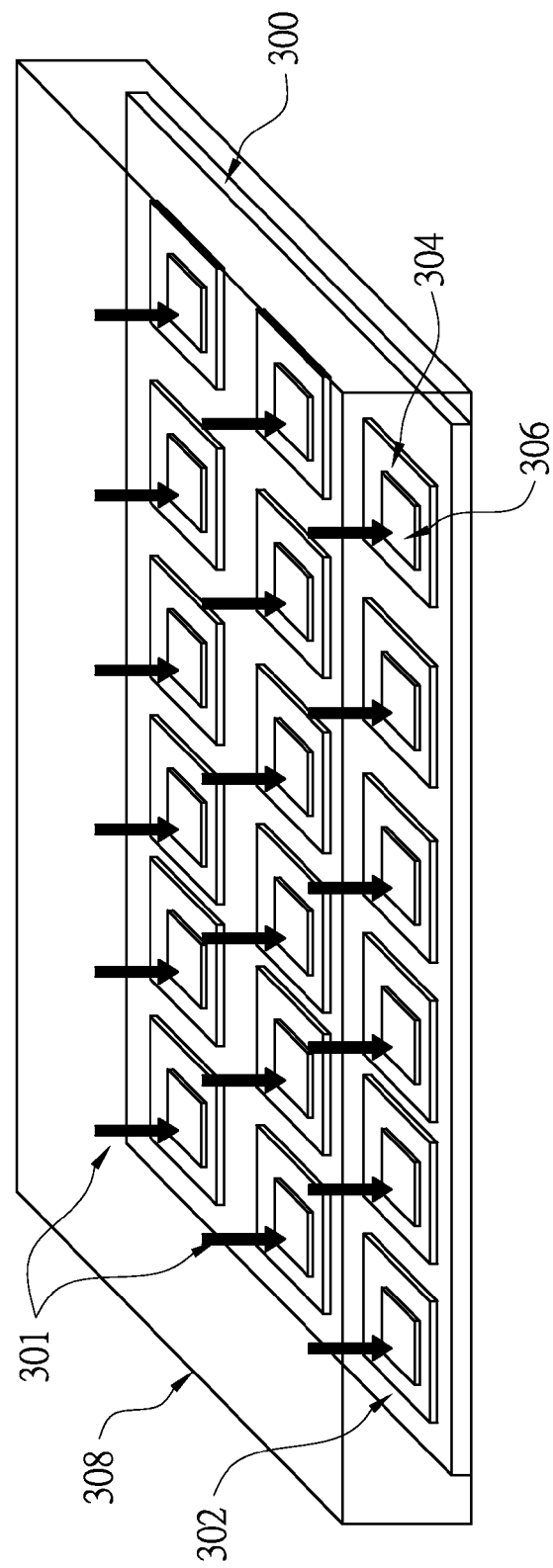
FIG. 3 is a diagram of a plasma chamber in accordance with various alternative embodiments.

FIG. 3 illustrates yet another alternative embodiment in which a magnetic or electric field is applied to induce localized plasma treatment. A plurality of packaging units 302 may be placed or affixed on a bottom carrier 300. Packaging units 302 include substrates 304, dies 306, bond pads (not shown), and SMDs (not shown) respectively. Bottom carrier 300 and packaging units 302 may be substantially similar to bottom carrier 102 and packaging units 106 respectively. Unlike the embodiments illustrated in FIG. 2, one plasma chamber 308 exposes the plurality of packaging units 302 to plasma. However, a localized magnetic or electric field is applied to portions of packaging units 302 corresponding to dies 306 as indicated by arrows 310. Because plasma is made of charged ion particles, applying a localized magnetic or electric field may enable localized plasma treatment. Therefore, portions of substrates 304 may be selectively treated. For example, an electrical change such as a voltage may be applied underneath packaging units 302 in the areas corresponding to dies 306. The charged ions of the plasma will be attracted to the areas corresponding to dies 306. Alternatively, a time-vary magnetic field may be applied underneath packaging units 302. Therefore, localized plasma treatment may be enabled.

Figure 4A:
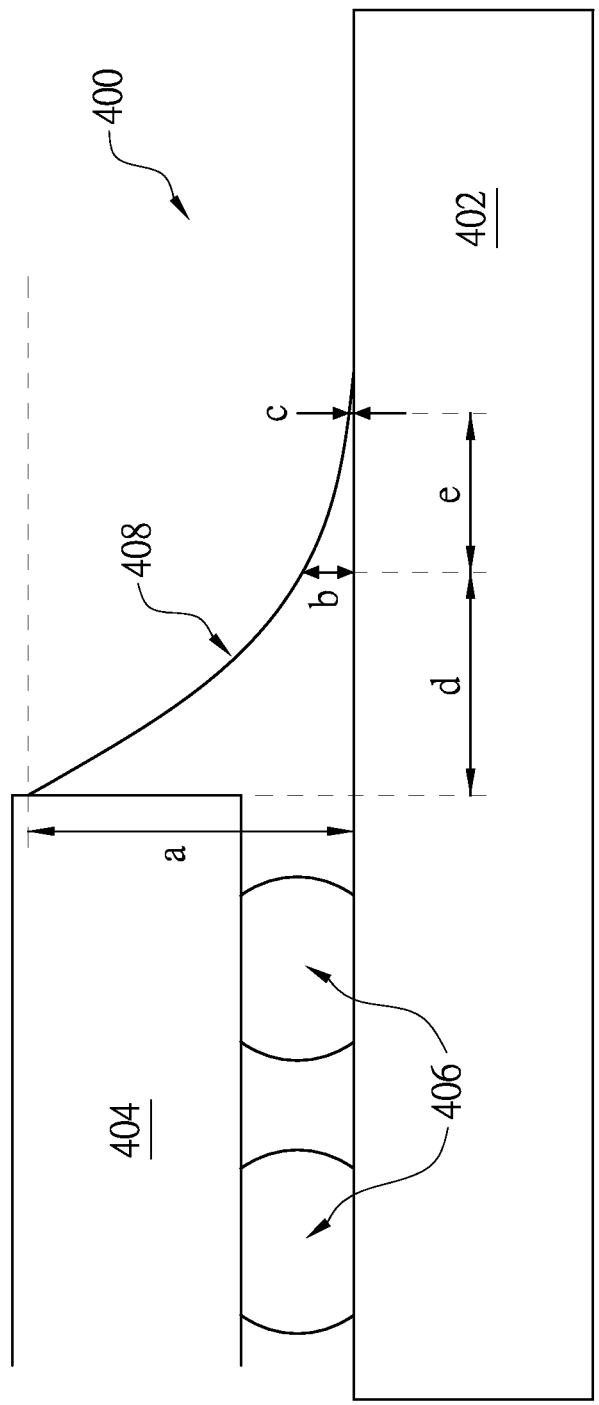
FIGS. 4A and 4B illustrate varying views of a portion of an integrated circuit structure in accordance with various embodiments.

FIG. 4A illustrates a cross-sectional view of a portion of an IC structure 400. Die 404 may be an active die having active components such as transistors interconnected to form functional circuits. Alternatively, die 404 may be any semiconductor die such as an interposer, a chip-on-wafer (CoW) structure, or the like. Substrate 402 may be formed of organic and/or inorganic materials. For example, the materials of substrate 402 may include epoxy, polymide, polyamine, polynitrile, polyacrylate, oxazole polymer, silicon, oxide, nitride, carbide, combinations thereof, or the like. An underfill 408 has been applied between die 404 and substrate 402. The material of underfill 408 may include a polymer (e.g., epoxy, polymide, polyamine, polynitrile, polyacrylate, oxazole polymer, and the like). Underfill 408 may also include a filler material (e.g., oxide, nitride, carbide, or the like) in additional to the polymer.

In various embodiments, underfill 408 includes a fillet having a shorter base portion (i.e., a smaller width) as exhibited by certain fillet proportions. For example, in FIG. 4A, height a is the fillet height (i.e., the distance from the highest point of the underfill fillet to substrate 402). Height b is the height of the underfill fillet relative to substrate 402 from an intermediary point, and height c marks the height from an endpoint of the underfill fillet to substrate 402. Generally, height c may be less than about 1 µm and is used to define the end of the fillet width. Height b may be measured from an intermediary fillet point so that the ratio of height a to height b may be about ten to one. Width d is the distance between the highest fillet point (having height a) to the intermediary fillet point (having height b), and width e is the distance from the intermediary fillet point to the fillet endpoint (having height c). In various embodiments, the ratio of width e to width d may be about 0.45 or less.

Figure 4B:
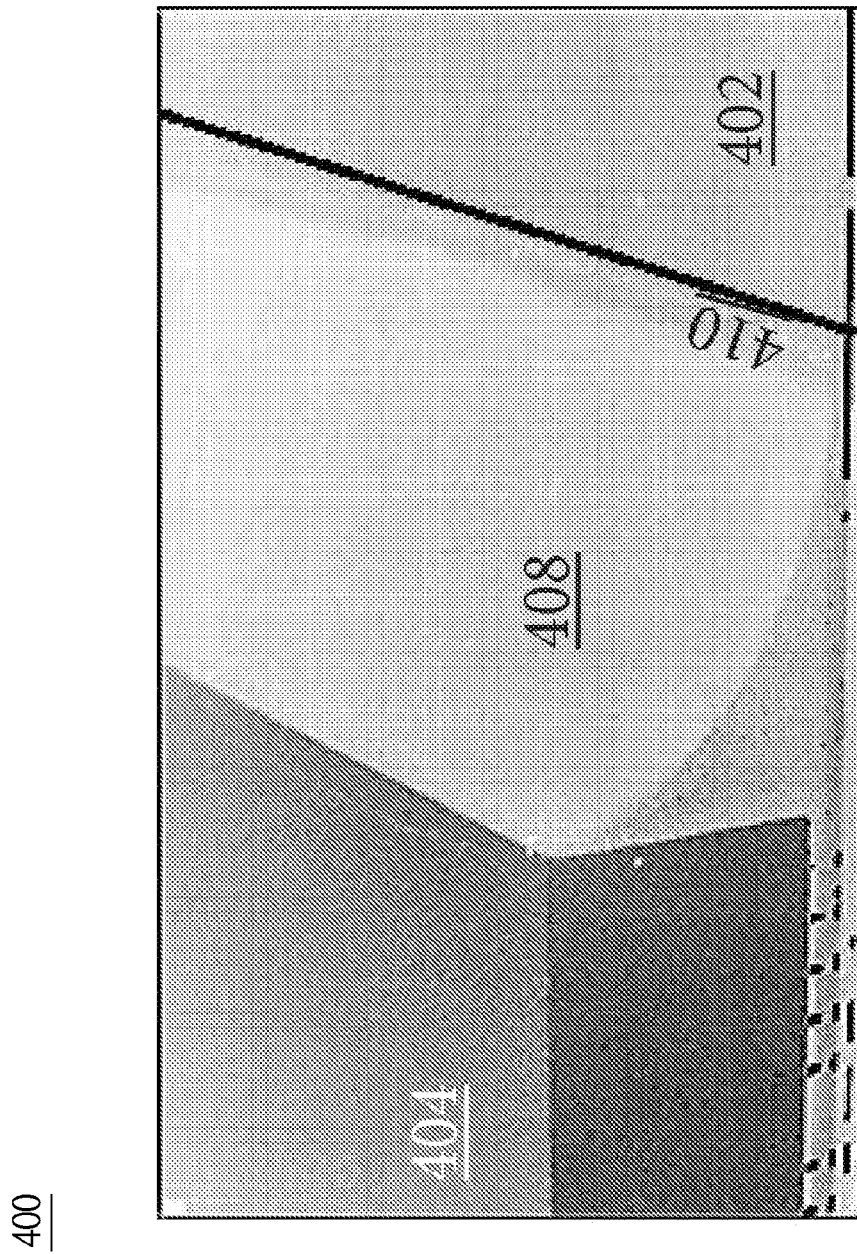

FIG. 4B illustrates an isotropic view of an integrated circuit (IC) structure 400. As shown by FIG. 4B, underfill 408 has a fillet border (marked by line 410) that is substantially uniform. For example, underfill 408 may have a fillet width 3σ value of 300 µm or less. That is, underfill 408's fillet width has a σ of about 100 µm or less, and assuming a normal distribution, 99.7% of points on underfill 408's fillet border have a width within 300 µm of the average fillet width. In some embodiments, underfill 408's fillet width may have a 3σ value of about 200 µm or less. Underfill 408 may have an average fillet width that is relatively small (e.g. less than about 1500 µm). The substantially uniform border and small fillet width may be achieved by selectively treating only a portion of substrate 402 (e.g., the portion corresponding to die 404) with plasma while other portions of substrate 402 remain untreated. Furthermore, substrate 402 may exhibit a relatively smooth surface texture because portions remain untreated (i.e., not texturized) by plasma. For example, substrate 402 may have a range of the distance between a highest and lowest point of about 365 nm or less.

Because underfill 408 has a fillet having a smaller base portion (i.e., a smaller width) and a smoother border, the minimum spacing requirement between die 404 and another IC component such as a SMD (not shown) may be reduced. For example, in various embodiments, the minimum spacing required between die 404 and another component may be reduced by about 50% or more.

In accordance with an embodiment, a method for integrated circuit packaging includes forming a packaging unit by attaching a die to a packaging substrate. A plasma treatment is applied to a first portion of the packaging substrate, wherein the first portion corresponds to a portion of the packaging substrate underneath the die. The plasma treatment is not applied to a second portion of the packaging substrate, wherein the second portion of the packaging substrate surrounds the first portion of the packaging substrate. An underfill material is applied to the first portion of the packaging substrate.

In accordance with another embodiment, a method for integrated circuit packaging includes attaching a device die to a packaging substrate to form a packaging unit. The packaging unit is placed on a bottom carrier of a jig. A top cover of the jig is placed over the packaging unit, wherein the top cover includes a first window exposing a first portion of the packaging unit corresponding to the device die, and wherein the top cover further covers a second portion surrounding the first portion of the packaging unit. A plasma treatment is applied to the first portion of the packaging unit through the first window of the jig.

In accordance with yet another embodiment, an integrated circuit (IC) structure includes a substrate, a die attached to the substrate, and an underfill having a portion disposed between the substrate and the die and a fillet extending past an edge of the die. The fillet has a fillet width having a standard deviation of about 100 micrometers or less.

Although the embodiments and their advantages have been described in detail, it should be understood that various changes, substitutions and alterations can be made herein without departing from the spirit and scope of the embodiments. For example, local plasma treatment may be performed in a variety of ways, from changing the design of the plasma chamber to applying a magnetic or electric field to control the plasma mobility.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for integrated circuit packaging comprising:
   forming a packaging unit by attaching a die to a packaging substrate;

attaching a surface mount device to the packaging substrate;

applying plasma treatment to a first portion and a third portion of the packaging substrate, wherein the first portion corresponds to a portion of the packaging substrate underneath the die, and wherein the third portion corresponds to a portion of the packaging substrate adjacent the surface mount device;

not applying plasma treatment to a second portion of the packaging substrate, wherein the second portion of the packaging substrate surrounds the first portion of the packaging substrate, and wherein the second portion of the packaging substrate is disposed between the first portion and the third portion of the packaging substrate; and applying an underfill material over the first portion of the packaging substrate.

2. The method of claim 1, wherein applying plasma treatment to the first portion of the packaging substrate and not applying plasma treatment to a second portion comprises using a jig to cover the second portion while exposing the first portion of the packaging substrate.

3. The method of claim 2, wherein the jig comprises a top cover and a bottom carrier, and wherein using the jig comprises:
placing the packaging unit on the bottom carrier;
placing the top cover over the packaging unit, wherein a portion of the top cover covers the second portion of the packaging substrate while a window in the top cover exposes the first portion of the packaging substrate; and
introducing plasma to the first portion of the packaging substrate through the window in the top cover.

4. The method of claim 1, wherein applying plasma treatment to the first portion of the packaging substrate and not applying plasma treatment to a second portion comprises applying a localized plasma chamber to the first portion of the packaging substrate.

5. The method of claim 1, wherein applying plasma treatment to the first portion of the packaging substrate and not applying plasma treatment to a second portion comprises applying a magnetic or electric field to the packaging unit during plasma treatment.

6. The method of claim 5, wherein applying a magnetic or electric field to the packaging unit comprises applying a charge under the first portion and not applying a charge under the second portion of the packaging substrate.

7. The method of claim 1, wherein applying an underfill material comprises jetting the underfill material over the first portion of the packaging substrate.

8. A method for integrated circuit packaging comprising:
attaching a device die to a packaging substrate to form a packaging unit;
placing the packaging unit on a bottom carrier of a jig;
placing a top cover of the jig over the packaging unit, wherein the top cover comprises a first window exposing a first portion of the packaging unit corresponding to the device die, and wherein the top cover further covers a second portion surrounding the first portion of the packaging unit; and
applying a plasma treatment to the first portion of the packaging unit through the first window of the jig, wherein the top cover of the jig is affixed to the bottom carrier of the jig while applying the plasma treatment.

9. The method of claim 8, further comprising:
removing the packaging unit from the jig; and
applying an underfill material to the first portion of the packaging unit.

10. The method of claim 8, wherein the first window is larger than the device die, and wherein an edge of the device die is separated from a nearest edge of the first window by a gap.

11. The method of claim 8, wherein the packaging unit further includes a surface mount device (SMD), and wherein the top cover of the jig covers the SMD.

12. The method of claim 8, wherein the packaging unit further includes a surface mount device (SMD), wherein the top cover of the jig comprises a second window exposing the SMD, and wherein the top cover covers a portion of the packaging substrate between the SMD and the device die.

13. The method of claim 8, wherein the jig comprises a metallic, polymer, or ceramic material.

14. The method of claim 8, further comprising affixing the top cover of the jig to the bottom carrier of the jig, while applying the plasma treatment, using a magnet, glue, or a latch.

15. The method of claim 8, further comprising including a polymer material in a portion of the jig configured to contact the packaging substrate.

16. A method packaging a semiconductor device comprising:
attaching a plurality of semiconductor devices to a plurality of packaging substrates, respectively, to form a plurality of packaged semiconductor devices;
exposing first portions of the plurality of packaged semiconductor devices corresponding to the plurality of semiconductor devices while covering second portions of the plurality of the packaged devices using a jig comprising a top cover and a bottom carrier;
selectively applying a hydrophilic surface treatment to the first portions of the plurality of packaging substrates corresponding to the plurality of semiconductor devices, wherein the top cover is affixed to the bottom carrier while selectively applying the hydrophilic surface treatment; and
applying an underfill material to the first portions of the plurality of packaged semiconductor devices.

17. The method of claim 16, wherein the second portions surround corresponding first portions of the plurality of packaged semiconductor devices.

18. The method of claim 16, wherein the hydrophilic surface treatment comprises a plasma treatment.

19. The method of claim 18, wherein the plasma treatment comprises using oxygen plasma, argon plasma, or a combination thereof.

20. The method of claim 16 further comprising attaching at least one surface mount device (SMD) to at least one of the plurality of packaging substrates, wherein exposing first portions of the plurality of packaged semiconductor devices further comprises exposing third portions of the plurality of packaged semiconductor devices corresponding to the at least one SMD.

* * * * *